United States Patent [19]
Allie et al.

[11] Patent Number: 5,586,189
[45] Date of Patent: Dec. 17, 1996

[54] ACTIVE ADAPTIVE CONTROL SYSTEM WITH SPECTRAL LEAK

[75] Inventors: Mark C. Allie, Oregon; Steven R. Popovich, Stoughton, both of Wis.

[73] Assignee: Digisonix, Inc., Middleton, Wis.

[21] Appl. No.: 166,698

[22] Filed: Dec. 14, 1993

[51] Int. Cl.$^6$ .................................................. A61F 11/06
[52] U.S. Cl. .................................................. 381/71; 381/94
[58] Field of Search ................................ 381/71, 94

[56] References Cited

U.S. PATENT DOCUMENTS

| | | | |
|---|---|---|---|
| 4,677,676 | 6/1987 | Eriksson | 381/71 |
| 4,677,677 | 6/1987 | Eriksson | 381/71 |
| 4,736,431 | 4/1988 | Allie et al. | 381/71 |
| 4,815,139 | 3/1989 | Eriksson et al. | 381/71 |
| 4,837,834 | 6/1989 | Allie | 381/71 |
| 4,987,598 | 1/1991 | Eriksson | 381/71 |
| 5,022,082 | 1/1991 | Eriksson et al. | 381/71 |
| 5,033,082 | 7/1991 | Eriksson et al. | 381/71 |
| 5,172,416 | 12/1992 | Allie et al. | 381/71 |
| 5,206,911 | 4/1993 | Eriksson et al. | 381/71 |
| 5,216,721 | 6/1993 | Melton | 381/71 |
| 5,216,722 | 6/1993 | Popovich | 381/71 |
| 5,278,780 | 1/1994 | Eguchi | 381/71 |
| 5,283,834 | 2/1994 | Goodman et al. | 381/71 |
| 5,337,366 | 8/1994 | Eguchi et al. | 381/71 |

FOREIGN PATENT DOCUMENTS 405173582  7/1993  Japan ........................................ 381/94

OTHER PUBLICATIONS

"Active Adaptive Sound Control In A Duct: A Computer Simulation", J. C. Burgess, Journal of Acoustic Society of America, 70(3), Sep. 1981, pp. 715–726.
"Number Theory In Science And Communcations", Berlin, Springer–Berlag, 1984, pp. 252, 261.
"Echo Cancellation Algorithms", Gritton and Lin, IEEE ASSP Magazine, Apr. 1984, pp. 30–38.

Primary Examiner—Edward L. Coles, Sr.
Assistant Examiner—Jerome Grant, II
Attorney, Agent, or Firm—Andrus, Sceales, Starke & Sawall

[57] ABSTRACT

An act control system introduces a control signal put transducer (14) to combine with the system input signal (6) and yield a system output signal (8). An adaptive filter model (40) has an output (46) supplying a correction signal to the output transducer to introduce the control signal. The model has a first error input (44, 232, 248) driven by an error signal from an error transducer (16) to drive the correction signal toward a value matching the system input signal to modify and/or cancel same. The model has a second error input (202, 224, 240, 268, 280) selectively driven by a spectral leak signal (212) to drive the correction signal away from such matching value by driving the correction signal towards zero, to selectively constrain performance of the model in response to a given condition of a given parameter.

39 Claims, 3 Drawing Sheets

ACTIVE ADAPTIVE CONTROL SYSTEM WITH SPECTRAL LEAK

BACKGROUND AND SUMMARY

The invention relates to active adaptive control systems, and more particularly to an improvement for intentionally selectively constraining performance when control is undesired.

The invention arose during continuing development efforts directed toward active acoustic attenuation systems. Active acoustic attenuation involves injecting a canceling acoustic wave to destructively interfere with and cancel an input acoustic wave. In an active acoustic attenuation system, the output acoustic wave is sensed with an error transducer, such as a microphone or an accelerometer, which supplies an error signal to an adaptive filter control model which in turn supplies a correction signal to a canceling output transducer, such as a loudspeaker or a shaker, which injects an acoustic wave to destructively interfere with the input acoustic wave and cancel same such that the output acoustic wave at the error transducer is zero or some other desired value.

An active adaptive control system minimizes an error signal by introducing a control signal from an output transducer to combine with the system input signal and yield a system output signal. The system output signal is sensed with an error transducer providing the error signal. An adaptive filter model has an error input from the error signal, and outputs a correction signal to the output transducer to introduce a control signal matching the system input signal, to minimize the error signal.

The present invention is applicable to active adaptive control systems, including active acoustic attenuation systems. In the present invention, the adaptive filter model is provided with a pair of error inputs. The system drives the first error input to drive the correction signal toward a value matching the system input signal, and selectively drives the second error input to drive the correction signal away from the matching signal by instead driving the correction signal towards zero. A spectral leak signal is selectively supplied to the second error input in response to a given condition of a given parameter, such that in the presence of the given condition, the spectral leak signal drives the correction towards zero, and such that in the absence of the given condition, the error signal from the error transducer drives the correction signal towards the noted matching value.

The method of the present invention involves selectively constraining performance of the model by driving the output of the model towards zero in response to a given condition of a given parameter. In preferred form, the output of the model is driven towards zero by driving the output of the model towards the error input, such that when the model adapts to drive the error signal towards zero, the output of the model is also driven towards zero. This is preferably accomplished by providing a copy of the model and supplying the output of the copy to the error input, such that the model adapts to drive the error input towards zero which in turn requires that the output of the copy and hence the output of the model are driven towards zero to provide the noted constrained performance when modification and/or cancellation of the system input signal by the model is undesired.

DETAILED DESCRIPTION

Figure 1:
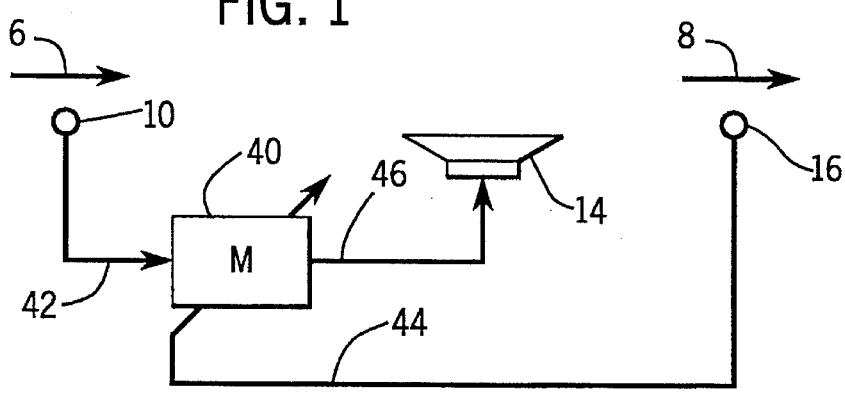
FIG. 1 is a schematic illustration of an active adaptive control system.
Figure 5:
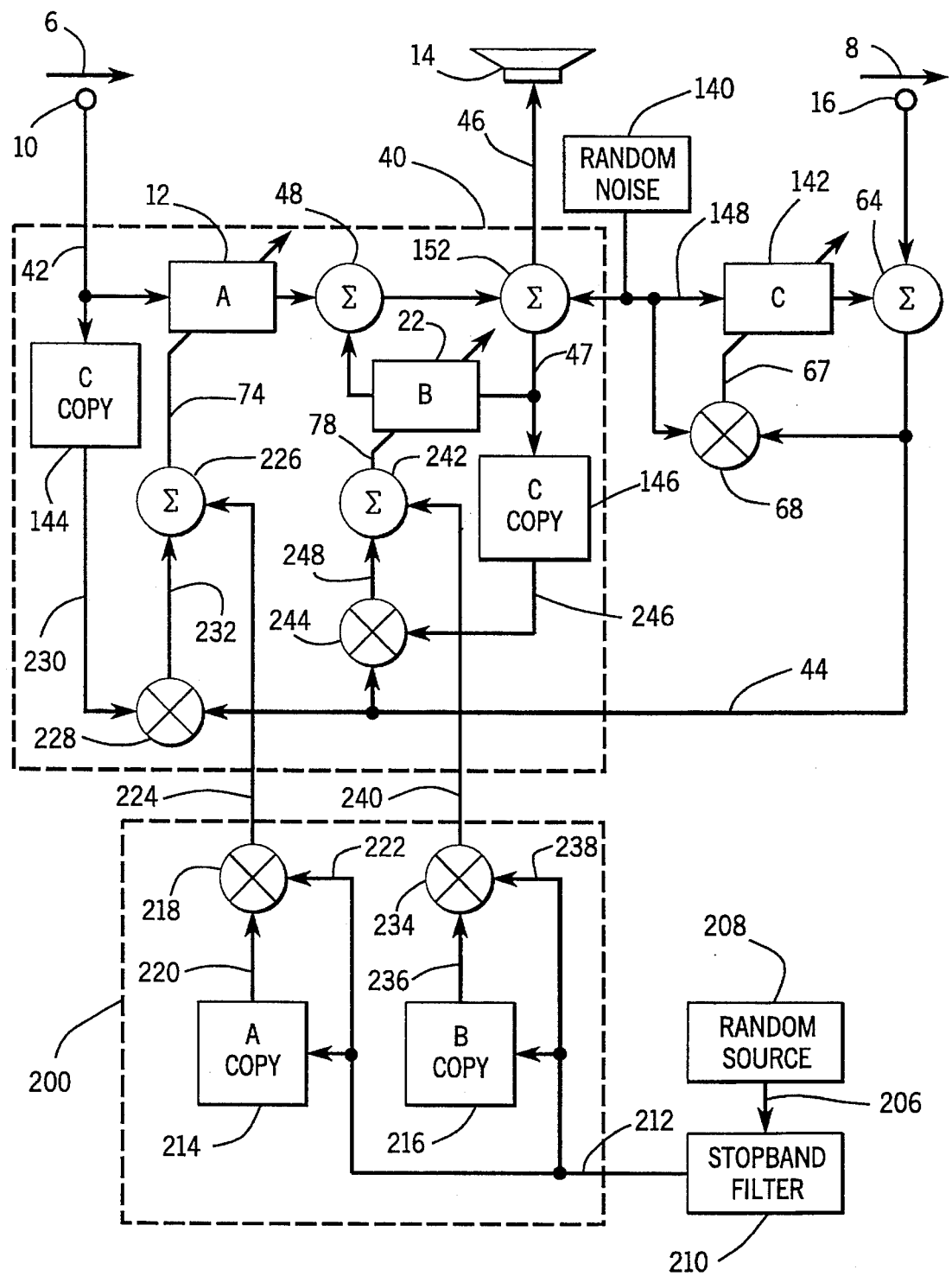
FIG. 5 shows a further embodiment of the invention.

FIG. 1 is similar to FIG. 5 of U.S. Pat. No. 4,677,676, incorporated herein by reference, and uses like reference numerals to facilitate understanding. The system introduces a control signal from an output transducer 14, such as a loudspeaker, shaker, or other actuator or controller, to combine with the system input signal 6 and yield a system output signal 8. An input transducer 10, such as a microphone, accelerometer, or other sensor, senses the system input signal. An error transducer 16, such as a microphone, accelerometer, or other sensor, senses the system output signal and provides an error signal. Adaptive filter model 40 adaptively models the system and has a model input 42 from input transducer 10, an error input 44 from error transducer 16, and a model output 46 outputting a correction signal to output transducer 14 to introduce the control signal. In a known alternative, the input signal at 42 may be provided by one or more error signals, in the case of a periodic system input signal, "Active Adaptive Sound Control In A Duct: A Computer Simulation" J. C. Burgess, Journal of Acoustic Society of America, 70(3), September 1981, pages 715–726, U.S. Pat. Nos. 5,206,911, 5,216,722, incorporated herein by reference.

The present invention provides an active adaptive control system wherein the performance of model 40 is intentionally and selectively constrained by driving the output 46 of the model towards zero in response to a given condition of a given parameter. For example, in an active noise control system, it may be desirable to cancel noise only in a given frequency band, and leave the noise uncanceled for frequencies outside the band. In other control applications, it may be desirable to selectively control the system output signal by selectively controlling introduction of the control signal from output transducer 14 to match or not match the system input signal.

Figure 2:
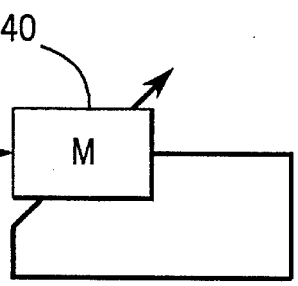
FIG. 2 is a schematic illustration of an adaptive filter model, and illustrates a principle employed by the present invention.
Figure 3:
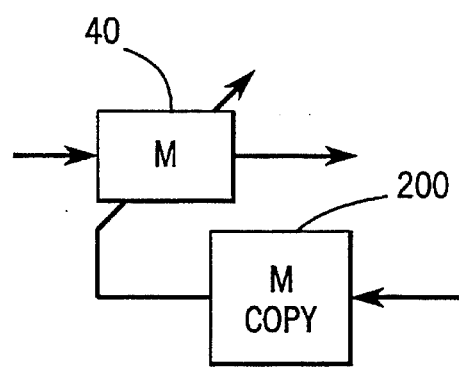
FIG. 3 is like FIG. 2 and shows another manner of implementing the principle thereof.

One manner of constraining system performance is to drive the output of model 40 towards zero and away from a value matching system input signal 6. One way of accomplishing this is shown in FIG. 2 wherein the output of model 40 is supplied to its error input, such that when the model adapts to drive its error input towards zero, the output of the model is necessarily also driven towards zero. FIG. 3 shows another manner of implementing this principle wherein a copy of the model is provided at 200, and the output of model copy 200 supplies the error signal to the error input of model 40. In FIG. 3, model 40 adapts to drive its error input towards zero, which in turn requires that the output of copy 200 be driven towards zero, which in turn means that the output of model 40 is driven towards zero because M copy 200 is a duplicate of model 40. These principles are utilized in the present invention.

Figure 4:
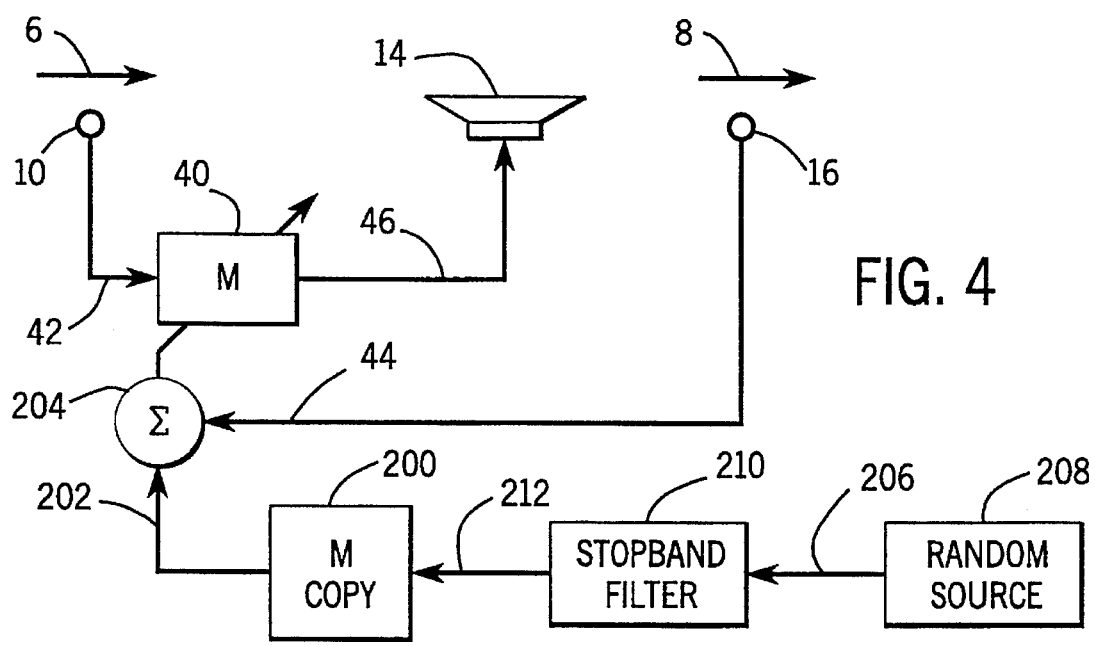
FIG. 4 is a schematic illustration of an active adaptive control system in accordance with the present invention.

Model 40, FIG. 4, normally adapts to a converged condition wherein its output at 46 provides a correction signal to output transducer 14 which outputs a control signal matching the system input signal or a designated relative value correlated thereto. For example, in a noise cancellation system, the matching control signal from output transducer 14 cancels the input noise. In the present invention, in response to a given condition of a given parameter, the output of model 40 is driven towards zero by driving the output of the model towards its error input, such that when the model adapts to drive the error signal towards zero, the output of the model is also driven towards zero. This is accomplished by providing a copy 200 of model 40, and supplying the output of the copy to an error input 202 of the model which is summed at summer 204 with the error signal at error input 44 from error transducer 16. The model adapts to drive the error input towards zero which in turn requires that the output of copy 200 and hence the output of model 40 are driven towards zero, to provide the noted constrained performance. The driving of model output 46 towards zero provides a zero or at least a reduced correction signal to output transducer 14 to constrain or reduce modification and/or cancellation of the system input signal 6.

A random signal is provided at 206 from an auxiliary random signal source 208, preferably provided by a Galois sequence, M.R. Schroeder, "Number Theory In Science And Communications" Berlin Springer-Berlag, 1984, pages 252–261, though other random signal sources may be used, uncorrelated with the system input signal 6. The Galois sequence is a pseudo random sequence that repeats after $2^M-1$ points, where M is the number of stages in a shift register. The Galois sequence is preferred because it is easy to calculate and can easily have a period much longer than the response time of the system. The random signal is supplied through a stopband filter 210 to model copy 200 at 212. Stopband filter 210 blocks frequencies in the stopband, and passes frequencies outside the stopband. This arrangement provides a spectral leak signal at 202 in response to a given condition of a given parameter, for example a frequency outside the stopband. In such implementation, the noted given parameter is frequency, and the given condition is a designated sub-optimum performance band outside the stopband.

The spectral leak error signal at 202 drives the correction signal at model output 46 towards zero and provides sub-optimum performance of model 40. Outside of the sub-optimum performance band, i.e. within the stop-band of filter 210, there is no signal at 212 and hence the output of copy 200 is undefined, and the error signal from error transducer 16 at error input 44 is maximally effective and model 40 optimally responds thereto and drives the correction signal at output 46 toward a value matching the system input signal 6. When the spectral leak signal is present at error input 202, it constrains performance of model 40 by driving or at least attempting to drive the correction signal at model output 46 towards zero. The relative influence or amplitudes of the error signals at error inputs 44 and 202 are adjusted to provide the desired relative dominance. Where it is desired to eliminate all modification and/or cancellation of the system input signal when the frequency is outside the stopband of filter 210, then the noted relative amplitudes are set such that the error signal at error input 202 dominates the error signal at error input 44, and hence the correction signal at model output 46 is driven towards zero and away from a value matching the system input signal 6.

The present method involves driving error input 44 to drive the correction signal at model output 46 toward a value matching the system input signal, and selectively driving error input 202 to drive the correction signal at model output 46 away from the matching value by driving the correction signal towards zero. The arrangement provides a spectral leak signal to error input 202 in response to the noted given condition of the given parameter, e.g. a frequency outside the stopband, such that in the presence of the given condition, the spectral leak signal drives the correction signal at model output 46 towards zero, and in the absence of the given condition the error signal at error input 44 drives the correction signal at model output 46 towards a value matching the system input signal 6.

Stopband filter 210 blocks frequencies in a given stopband at which modification or cancellation of the system input signal 6 by model 40 is desired. Filter 210 passes frequencies in a given passband at which modification or cancellation of the system input signal by model 40 is undesired. The control signal output by output transducer 14 is driven toward a value matching the system input signal 6 only for frequencies in the stopband. At frequencies in the stopband, the error signal at error input 44 is dominant, and the control signal output by output transducer 14 is driven toward a value matching the system input signal 6. At frequencies in the passband, the error signal at error input 202 is dominant, and the control signal output by output transducer 14 is driven away from a value matching the system input signal 6.

FIG. 5 is similar to FIGS. 19 and 20 of the incorporated '676 patent, and uses like reference numerals where appropriate to facilitate understanding. As noted in the incorporated '676 patent, model M at 40 is preferably an adaptive recursive filter having a transfer function with both poles and zeros. Model M is provided by an IIR, infinite impulse response, filter, e.g. a recursive least mean square, RLMS, filter having a first algorithm filter provided by an FIR, finite impulse response, filter, e.g. a least mean square, LMS, filter A at 12, and a second algorithm filter provided by an FIR filter, e.g. an LMS filter, B at 22. Filter A provides a direct transfer function, and filter B provides a recursive transfer function. The transfer function from output transducer 14 to error transducer 16 is modeled by a filter, e.g. an LMS or RLMS filter, C at 142, as in the incorporated '676 patent.

Auxiliary random signal source 140 introduces a random signal into the output of model 40 at summer 152 and into the C model at 148. The auxiliary random signal from source 140 is random and uncorrelated with the system input signal 6, and is also uncorrelated with auxiliary random signal source 208, and in preferred form provided by a Galois sequence, M. R. Schroeder, "Number Theory In Science And Communications", Berlin Springer-Berlag, 1984, pages 252–261, though other random uncorrelated signal sources may be used. The Galois sequence is a pseudo random sequence that repeats after $2^M-1$ points, where M is the number of stages in a shift register. The Galois sequence is preferred because it is easy to calculate and can easily have a period much longer than the response time of the system. The input 148 to C model 142 is multiplied with the error signal from error transducer 16 at multiplier 68, and the resultant product provided as weight update signal 67. Model 142 models the transfer function from output transducer 14 to error transducer 16, including the transfer function of each. Alternatively, the transfer function from output transducer 14 to error transducer 16 may be modeled without a random signal source, as in U.S. Pat. No. 4,987,589, incorporated herein by reference. Auxiliary source 140 introduces an auxiliary random signal such that error transducer 16 also senses the auxiliary signal from the auxiliary source. The auxiliary signal may be introduced into the recursive loop of the A and B filters as in FIG. 19 of the incorporated '676 patent at summer 152, or alternatively the auxiliary signal may be introduced into the model after the recursive loop, i.e. introducing the auxiliary signal only to line 46, and not to line 47. As in the incorporated '676 patent, copies of model 142 are provided at 144 and 146 to compensate the noted transfer function.

The outputs of filters A and B are summed at summer 48, whose output is summed at summer 152 with the output of random signal source 140 to provide an output resultant sum which provides the model output at 46 supplying the noted correction signal to output transducer 14. The output of model 142 is summed at summer 64 with the output of error transducer 16, and the resultant sum supplied as the error input to model 142 and as an error input to model 40. Alternatively, the output of error transducer 16 may be supplied directly to an error input of model 40 without being supplied through summer 64.

M copy 200, FIG. 4, is provided by a copy of A filter 12 at A copy 214, FIG. 5, and a copy of B filter 22 at B copy 216. Multiplier 218 multiplies the output 220 of A copy 214 and the input 222 of A copy 214, and supplies the output resultant product at 224 to summer 226. Multiplier 228 multiplies the output 230 of C copy 144 and the error input at 44, and supplies the output resultant product at 232 to summer 226. Summer 226 sums the inputs 232 and 224, and supplies the output resultant sum as weight update signal 74 to A filter 12. Multiplier 234 multiplies the output 236 of B copy 216 and the input 238 of B copy 216, and supplies the output resultant product at 240 to summer 242. Multiplier 244 multiplies the output 246 of C copy 146 and the error input at 44, and supplies the output resultant product at 248 to summer 242. The summer 242 sums the inputs 248 and 240, and supplies the output resultant sum as weight update signal 78 to B filter 22. The input to A copy 214 and to B copy 216 is provided by the output 212 of stopband filter 210 receiving the noted random input signal at 206 from random signal source 208.

The error signals at error inputs 232 and 224 oppositely drive the model. The error signal at error input 232 of the direct transfer function filter A drives the correction signal at 46 towards a value matching the system input signal 6. The error signal at error input 224 of filter A drives the correction signal at 46 away from the noted matching value by driving the correction signal towards zero As noted above, this is accomplished by using a copy 214 of the A filter and supplying the output of such copy as an error input to the adaptive model such that in attempting to drive the error input to zero, the model must drive its output to zero. The signal at error input 224 is provided only in response to a given condition of a given parameter, e.g. when the frequency is outside the stopband of filter 210. The relative amplitudes of the input signals at error inputs 232 and 224 are adjusted such that the signal at error input 224 dominates when both are present, or the degree of dominance is adjusted to in turn adjust the amount of constrainment of performance of the model so that the correction signal at 46 is driven towards zero but never reaches zero, such that there is still some modification and/or cancellation of the system input signal, though to a reduced degree. When the frequency is in the stopband of filter 210, there is no output at 212, and hence no input to A copy 214 and hence the latter's output is undefined, whereby error input 232 from error signal 44 from error transducer 16 dominates and hence drives correction signal 46 to a value which matches the system input signal 6 to provide modification and/or control of the latter. The error inputs. 248 and 240 to the recursive transfer function filter B of model 40 function comparably to error inputs 232 and 224, respectively. Model 40 has a first error input provided at 232 and 248 from error transducer 16 driving the output of the model towards a value matching the system input signal 6. Model 40 has a second error input at 224 and 240 selectively driving the output of model 40 away from such matching value and instead driving the correction signal 46 towards zero.

Figure 6:
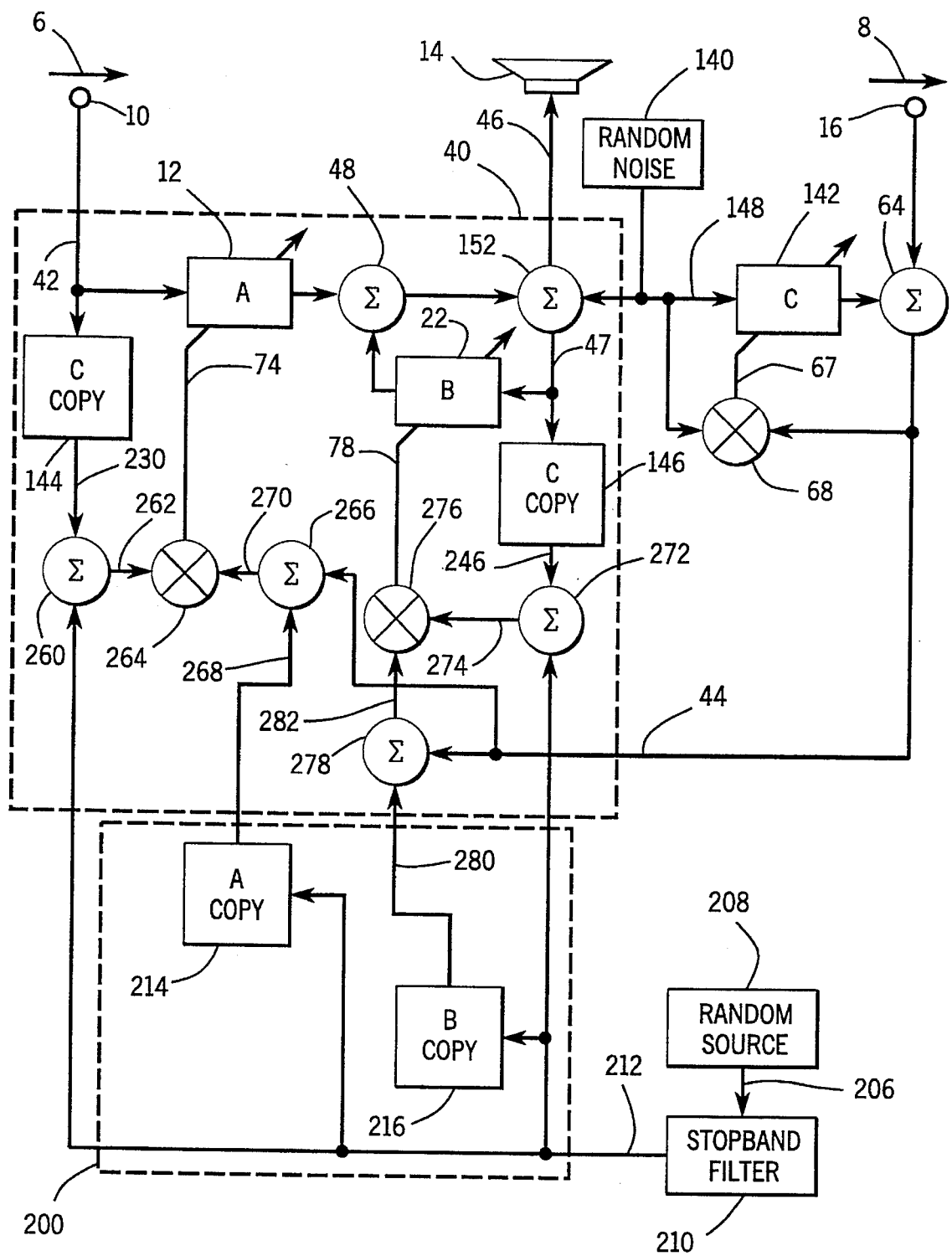
FIG. 6 shows a further embodiment of the invention.

FIG. 6 is similar to FIG. 5 and uses like reference numerals where appropriate to facilitate understanding. Summer 260 sums the output 230 of C copy 144 and the output 212 of stopband filter 210 which supplies the input to A copy 214, and supplies the output resultant sum at 262 to multiplier 264. Summer 266 sums the output 268 of A copy 214 and the error input at 44, and supplies the output resultant sum at 270 to multiplier 264. Multiplier 264 multiplies the inputs 262 and 270, and supplies the output resultant product as weight update signal 74 to A filter 12. Multiplier 272 multiplies the output 246 of C copy 146 and the output 212 of stopband filter 210 which supplies the input to B copy 216, and supplies the output resultant product at 274 to multiplier 276. Summer 278 sums the output 280 of B copy 216 and the error input at 44, and supplies the output resultant sum at 282 to multiplier 276. Multiplier 276 multiplies inputs 282 and 274, and supplies the output resultant product as weight update signal 78 to B filter 22.

The error signals at 44 and 268 oppositely drive the model. The error signal at error input 44 of the direct transfer function filter A drives the correction signal at 46 towards a value matching the system input signal 6. The error signal at error input 268 of filter A drives the correction signal at 46 away from the noted matching value by driving the correction signal towards zero. As noted above, this is accomplished by using a copy 214 of the A filter and supplying the output of such copy as an error input to the adaptive model such that in attempting to drive the error input to zero, the model must drive its output to zero. The signal at error input 268 is provided only in response to a given condition of a given parameter, e.g., when the frequency is outside the stopband of filter 210. The relative amplitudes of the input signals at error inputs 44 and 268 to summer 266 are adjusted such that the signal at error input 268 dominates when both are present, or the degree of dominance is adjusted to in turn adjust the amount of constrainment of performance of the model so that the correction signal at 46 is driven towards zero but never reaches zero, such that there is still some modification and/or cancellation of the system input signal, though to a reduced degree. When the frequency is in the stopband of filter 210, there is no output at 212, and hence no input to A copy 214 and hence the latter's output is undefined, whereby error input 44 to summer 266 from error transducer 16 dominates and hence the model drives correction signal 46 to a value which matches the system input signal 6 to provide modification and/or control of the latter. The error inputs 44 and 280 at summer 278 to the recursive transfer function filter B of model 40 function comparably to error inputs 44 and 268 at summer 266, respectively. Model 40 in FIG. 6 has a first error input provided at 44 to summers 266 and 278 from error transducer 16 driving the output of the model towards a value matching the system input signal 6. Model 40 has a second error input at 268 and 280 selectively driving the output of model 40 away from such matching value and instead driving the correction signal 46 towards zero.

It is recognized that various equivalents, alternatives and modifications are possible within the scope of the appended claims.

We claim:

1. An active adaptive control method comprising introducing a control signal from an output transducer to combine with a system input signal and yield a system output signal, sensing said system output signal with an error transducer providing an error signal, providing a spectral leak signal in response to a given condition of a given parameter, providing an adaptive filter model having an output outputting a correction signal to said output transducer to introduce said control signal, providing said adaptive filter model with a first error input from said error signal driving said correction signal towards a value matching said system input signal, and a second error input from said spectral leak signal constraining performance of said model by driving said correction signal towards zero.

2. The method according to claim 1 wherein said given parameter is frequency, and said given condition is a designated sub-optimum performance band, such that in said designate sub-optimum performance band, said spectral leak error signal drives said correction signal towards zero and provides sub-optimum performance of said model, and such that outside of said designated sub-optimum performance band, said error signal is maximally effective and said model optimally responds thereto and drives said correction signal toward a value matching said system input signal.

3. The method according to claim 1 comprising providing a copy of said model, and supplying said spectral leak signal through said copy to said second error input.

4. The method according to claim 1 comprising providing a filter responsive to said given parameter, and supplying said spectral leak signal through said filter to said second error input in response to said given condition of said given parameter.

5. The method according to claim 1 comprising providing a copy of said model, providing a filter responsive to said given parameter, and supplying said spectral leak signal through said filter and through said copy to said second error input in response to said given condition of said given parameter.

6. The method according to claim 5 comprising supplying the output of said filter to the input of said copy, and supplying the output of said copy to said second error input, such that said spectral leak signal is supplied first through said filter and then through said copy.

7. An active adaptive control method comprising introducing a control signal from an output transducer to combine with a system input signal and yield a system output signal, sensing said system output signal with an error transducer providing an error signal, providing a spectral leak signal from an auxiliary random signal source uncorrelated with said system input signal in response to a given condition of a given parameter, providing an adaptive filter model having an output outputting a correction signal to said output transducer to introduce said control signal, providing said model with a first error input from said error signal driving said correction signal toward a value matching said system input signal, providing said model with a second error input from said spectral leak signal constraining performance of said model in response to said given condition of said given parameter and driving said correction signal away from said matching value.

8. The method according to claim 7 comprising providing a copy of said model, and supplying said spectral leak signal from said auxiliary random signal source through said copy to said second error input.

9. The method according to claim 7 comprising providing a filter responsive to said given parameter, and supplying said spectral leak signal from said auxiliary random signal source through said filter to said second error input.

10. The method according to claim 7 comprising providing a filter responsive to said given parameter, providing a copy of said model, and supplying said spectral leak signal from said auxiliary random signal source through said filter and through said copy to said second error input.

11. The method according to claim 7 wherein said given parameter is frequency, and said given condition is a designated sub-optimum performance band, such that in said designated sub-optimum performance band, said spectral leak signal provides sub-optimum performance of said model, and such that outside of said designated sub-optimum performance band said error signal is maximally effective and said model optimally responds thereto and drives said correction signal toward said matching value.

12. An active adaptive control method comprising introducing a control signal from an output transducer to combine with a system input signal and yield a system output signal, sensing said system output signal with an error transducer providing an error signal, providing an adaptive filter model having an error input from said error signal and having an output supplying a correction signal to said output transducer to introduce said control signal providing a stopband filter supplying a filtered signal to said model, said filter blocking frequencies in a given stopband at which control of said system input signal by said model is desired, said filter passing frequencies in a given passband at which control of said system input signal by said model is undesired.

13. The method according to claim 12 comprising driving said control signal toward a value matching said system input signal only for frequencies in said stopband.

14. The method according to claim 12 comprising driving said control signal toward a value matching said system input signal for frequencies in said stopband, and driving said control signal away from a value matching said system input signal for frequencies in said passband.

15. The method according to claim 12 comprising providing an auxiliary random signal source supplying a random input signal to said stopband filter uncorrelated with said system input signal.

16. The method according to claim 12 comprising providing a copy of said model having an output supplied to said model.

17. The method according to claim 12 comprising providing said adaptive filter model with a second error input, and supplying said filtered signal to said second error input.

18. The method according to claim 17 comprising providing an auxiliary random signal source supplying a random input signal to said stopband filter uncorrelated with said system input signal, providing a copy of said model having an input from said stopband filter and an output supplied to said second error input.

19. An active adaptive control method comprising introducing a control signal from an output transducer to combine with a system input signal and yield a system output signal, providing an adaptive filter model having an output supplying a correction signal to said output transducer to introduce said control signal to combine with said system input signal and yield said system output signal, providing said adaptive filter model with a pair of error inputs, driving the first of said error inputs to drive said correction signal toward a value matching said system input signal, selectively driving the second of said second error inputs to drive said correctional away from said matching value by driving said correction signal towards zero, and supplying an error signal to said first error input from an error transducer sensing said system output signal, and selectively supplying a spectral leak signal to said second error input in response to a given condition of a given parameter such that in the presence of said given condition, said spectral leak signal drives said correction signal towards zero, and in the absence of said given condition, said error signal drives said correction signal towards said matching value.

20. An active adaptive control method comprising introducing a control signal from an output transducer to combine with a system input signal and yield a system output signal, sensing said system output signal with an error transducer providing an error signal, providing an adaptive filter model having an output outputting a correction signal to said output transducer to introduce said control signal, providing said adaptive filter model with a first error input from said error signal driving said correction signal towards a value matching said system input signal, providing said adaptive filter model with a second error input, providing a copy of said model, providing a spectral leak signal in response to a given condition of a given parameter and supplying said spectral leak signal through said copy to said second error input to constrain performance of said model by driving said correction signal away from said matching value.

21. An active adaptive control system comprising an output transducer introducing a control signal to combine with a system input signal and yield a system output signal, an error transducer sensing said system output signal and providing an error signal, an adaptive filter model having an output outputting a correction signal to said output transducer to introduce said control signal and having a first error input from said error signal driving said correction signal towards a value matching said system input signal, and having a second error input, a spectral leak signal source responsive to a given condition of a given parameter and supplying a spectral leak signal to said second error input to constrain performance of said model by driving said correction signal away from said matching value, wherein said spectral leak signal source comprises a copy of said model having an output supplied to said second error input.

22. The invention according to claim 21 wherein said spectral leak signal source further comprises a filter responsive to a given condition of a given parameter and having an output supplied to the input of said copy.

23. The invention according to claim 22 wherein said spectral leak signal source further comprises an auxiliary random signal source uncorrelated with said system input signal and having an output supplied to the input of said filter, such that said spectral leak signal is supplied from said auxiliary random signal source through said filter and through said copy to said second error input.

24. An active adaptive control system comprising an output transducer introducing a control signal to combine with a system input signal and yield a system output signal, an error transducer sensing said system output signal and providing an error signal, an adaptive filter model having an output outputting a correction signal to said output transducer to introduce said control signal and having a first error input from said error signal driving said correction signal towards a value matching said system input signal, and having a second error input, a spectral leak signal source responsive to a given condition of a given parameter and supplying a spectral leak signal to said second error input to constrain performance of said model by driving said correction signal away from said matching value, and a second adaptive filter model adaptively modeling the transfer function from said output transducer to said error transducer, a first auxiliary random signal source supplying a random signal to said second adaptive filter model uncorrelated with said system input signal, and wherein said spectral leak signal source comprises a second auxiliary random signal source supplying a random signal to said second error input uncorrelated with said system input signal.

25. The invention according to claim 24 wherein said random signals from said first and second auxiliary random signal sources are uncorrelated with each other.

26. An active adaptive control system comprising an output transducer introducing a control signal to combine with a system input signal and yield a system output signal, an error transducer sensing said system output signal and providing an error signal, an adaptive filter model having an output outputting a correction signal to said output transducer to introduce said control signal and having a first error input from said error signal driving said correction signal towards a value matching said system input signal, and having a second error input, a spectral leak signal source responsive to a given condition of a given parameter and supplying a spectral leak signal to said second error input to constrain performance of said model by driving said correction signal away from said matching value, wherein said adaptive filter model comprises an IIR filter having an FIR filter A and another FIR filter B each having a first error input from said error signal and each having a second error input, and wherein said spectral leak signal source comprises a copy of filter A having an output supplied to said second error input of filter A, and a copy of filter B having an output supplied to said second error input of filter B.

27. The invention according to claim 26 comprising an auxiliary random signal source uncorrelated with said system input signal, a stopband filter having an input from said auxiliary random signal source, a third summer summing the input filter A and the output of said stopband filter and supplying the output resultant sum to update filter A, a fourth summer summing the input filter B and the output of said stopband filter and supplying the output resultant sum to update filter B.

28. The invention according to claim 26 comprising an auxiliary random signal source uncorrelated with said system input signal, a stopband filter having an input from said auxiliary random signal source, wherein the output of said stopband filter provides an input to said copy of filter A and provides an input to said copy of filter B.

29. The invention according to claim 26 comprising a first summer summing said first and second error inputs to filter A and supplying the output resultant sum to update filter A, and a second summer summing said first and second error inputs to filter B, and supplying the output resultant sum to update filter B.

30. The invention according to claim 29 comprising a first multiplier multiplying the input to filter A and the error signal from said error transducer, and a second multiplier multiplying the input to filter B and the error signal from said error transducer, and wherein said first summer sums the output of said first multiplier and the output of said copy of filter A and supplies the output resultant sum as a weight update signal to filter A, and said second summer sums the output of said second multiplier and the output of said copy of filter B and supplies the output resultant sum as a weight update signal to filter B.

31. The invention according to claim 30 comprising a third multiplier multiplying the output of said copy of filter A and the input to said copy of filter A, and supplying the output resultant product as said second error input to filter A at said first summer, and a fourth multiplier multiplying the output of said copy of filter B and the input to said copy of filter B, and supplying the output resultant product as said second error input to filter B at said second summer.

32. The invention according to claim 31 comprising a second adaptive filter model adaptively modeling the transfer function from said output transducer to said error transducer, an auxiliary random signal source supplying a random signal to said second adaptive filter model uncorrelated with said system input signal, a first copy of said second model having an input receiving the input to filter A, wherein said first multiplier multiplies the output of said first copy of said second model and the error signal from said error transducer and supplies the output resultant product as said first error input to said first summer, a second copy of said second model having an input receiving the input to filter B, wherein said second multiplier multiplies the output of said second copy of said second model and the error signal from said error transducer and supplies the output resultant product as said first error input to said second summer.

33. The invention according to claim 32 comprising a second auxiliary random signal source uncorrelated with said system input signal and uncorrelated with said first mentioned auxiliary random signal source, a stopband filter having an input from said second auxiliary random signal source, wherein the output of said stopband filter provides the input to said copy of filter A and provides the input to said copy of filter B.

34. The invention according to claim 29 comprising a first multiplier multiplying the input to filter A and the output of said first summer and supplying the output resultant product as a weight update signal to filter A, and a second multiplier multiplying the input to filter B and the output of said second summer and supplying the output resultant product as a weight update signal to filter B.

35. The invention according to claim 34 comprising a third summer summing the input to filter A and the input to said copy of filter A and supplying the output resultant sum to said first multiplier for multiplication with the output of said first summer to provide the weight update signal to filter A, a fourth summer summing the input to filter B and the input to said copy of filter B and supplying the output resultant sum to said second multiplier for multiplication with the output of said second summer to provide the weight update signal to filter B.

36. The invention according to claim 35 comprising a second adaptive filter model adaptively modeling the transfer function from said output transducer to said error transducer, an auxiliary random signal source supplying a random signal to said second adaptive filter model uncorrelated with said system input signal, a first copy of said second model having an input receiving the input to filter A and an output supplied to said third summer, wherein said third summer sums the output of said first copy of said second model and the input to said copy of filter A and supplies the output resultant sum to said first multiplier for multiplication with the output of said first summer to provide the weight update signal to filter A, a second copy of said second model having an input receiving the input to filter B and an output supplied to said fourth summer, wherein said fourth summer sums the output of said second copy of said second model and the input to said copy of filter B and supplies the output resultant sum to said second multiplier for nultiplication with the output of said second summer to provide the weight update signal to filter B.

37. The invention according to claim 36 comprising a second auxiliary random signal source uncorrelated with said system input signal and uncorrelated with said first mentioned auxiliary random signal source, a stopband filter having an input from said second auxiliary random signal source, wherein the output of said stopband filter provides an input to said copy of filter A and provides an input to said third summer and provides an input to said copy of filter B and provides an input to said fourth summer.

38. An active adaptive control system comprising an output transducer introducing a control signal to combine with a system input signal and yield a system output signal, an error transducer sensing said system output signal and providing an error signal, an adaptive filter model having an output outputting a correction signal to said output transducer to introduce said control signal and having a first error input from said error signal driving said correction signal towards a value matching said system input signal, and having a second error input, a spectral leak signal source responsive to a given condition of a given parameter and supplying a spectral leak signal to said second error input to constrain performance of said model by driving said correction signal away from said matching value, wherein said adaptive filter model comprises an IIR filter having an FIR filter A and an FIR filter B, a second adaptive filter model adaptively modeling the transfer function from said output transducer to said error transducer, a first auxiliary random signal source supplying a random signal to said second model uncorrelated with said system input signal, a first copy of said second model having an input from the input to filter A, a second copy of said second model having an input from the input to filter B, a second auxiliary random signal source supplying a random signal uncorrelated with said system input signal, a stopband filter having an input from said second auxiliary random signal source, a copy of filter A having an input from said stopband filter, a copy of filter B having in input from said stopband filter, a first multiplier multiplying the output of said first copy of said second model and the error signal from said error transducer, a second multiplier multiplying the output of said second copy of said second model and the error signal from said error transducer, a third multiplier multiplying the output of said copy of filter A and the input to said copy of filter A provided from the output of said stopband filter, a fourth multiplier multiplying the output of said copy of filter B and the input to said copy of filter B provided from the output of said stopband filter, a first summer summing the outputs of said first and third multipliers and supplying the output resultant sum as a weight update signal to filter A, a second summer summing the outputs of said second and fourth multipliers and supplying the output resultant sum as a weight update signal to filter B.

39. An active adaptive control comprising an output transducer introducing a control signal to combine with a system input signal and yield a system output signal, an error transducer sensing said system output signal and providing an error an adaptive filter model having an output outputting a correction signal to said output transducer to introduce said control signal and having a first error input from said error signal driving said correction signal towards a value matching said system input signal, and having a second error input, a spectral leak signal source responsive to a given condition of a given parameter and supplying a spectral leak signal to said second error input to constrain performance of said model by driving said correction signal away from said matching value, wherein said adaptive filter model comprises an IIR filter having an FIR filter A and an FIR filter B, a second adaptive filter model adaptively modeling the transfer function from said output transducer to said error transducer, a first auxiliary random signal source supplying a random signal to said second model uncorrelated with said system input signal, a first copy of said second model having an input from the input to filter A, a second copy of said second model having an input from the input to filter B, a second auxiliary random-signal source supplying a random signal uncorrelated with said system input signal, a stopband filter having an input from said second auxiliary random signal source, a copy of filter A having an input from said stopband filter, a copy of filter B having an input from said stopband filter, a first summer summing the output of said first copy of said second model and the output of said stopband filter providing the input to said copy of filter A, a second summer summing the output of said second copy of said second model and the output of said stopband filter providing the input to said copy of filter B, a third summer summing the output of said copy of filter A and the error signal from said error transducer, a fourth summer summing the output of said copy of filter B and the error signal from said error transducer, a first multiplier multiplying the outputs of said first and third summers and supplying the output resultant product as a weight update signal to filter A, a second multiplier multiplying the outputs of said second and fourth summers and supplying the output resultant product as a weight update signal to filter B.

* * * * *